United States Patent
Yasuda

(10) Patent No.: US 10,148,246 B2
(45) Date of Patent: Dec. 4, 2018

(54) MULTIPLEXER AND RADIO-FREQUENCY (RF) FRONT-END MODULE

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 48 days.

(21) Appl. No.: 15/599,506

(22) Filed: May 19, 2017

(65) Prior Publication Data

US 2017/0359048 A1    Dec. 14, 2017

(30) Foreign Application Priority Data

Jun. 8, 2016 (JP) .................................. 2016-114557
Apr. 6, 2017 (JP) .................................. 2017-075685

(51) Int. Cl.
| | | |
|---|---|---|
| *H03H 9/25* | (2006.01) | |
| *H03H 9/64* | (2006.01) | |
| *H03H 9/72* | (2006.01) | |
| *H03H 9/02* | (2006.01) | |

(52) U.S. Cl.
CPC .... *H03H 9/02637* (2013.01); *H03H 9/02992* (2013.01); *H03H 9/25* (2013.01); *H03H 9/6483* (2013.01)

(58) Field of Classification Search
CPC ............... H03H 9/25; H03H 9/64; H03H 9/72
USPC ......................................................... 333/193
See application file for complete search history.

(56) References Cited

U.S. PATENT DOCUMENTS

| | | | | |
|---|---|---|---|---|
| 7,479,854 | B2 * | 1/2009 | Takamine ............ | H03H 9/0057 310/313 A |
| 8,436,696 | B2 * | 5/2013 | Nakai .................. | H03H 9/0038 310/313 D |
| 8,552,618 | B2 * | 10/2013 | Okumichi .......... | H03H 9/02763 310/313 B |
| 2014/0070906 | A1 | 3/2014 | Ikeuchi et al. | |
| 2015/0295697 | A1 | 10/2015 | Kawachi et al. | |

FOREIGN PATENT DOCUMENTS

| | | |
|---|---|---|
| JP | 2006-186433 A | 7/2006 |
| JP | 2014-007581 A | 1/2014 |
| JP | 2015-201808 A | 11/2015 |
| WO | 2013/069225 A1 | 5/2013 |

OTHER PUBLICATIONS

Official Communication issued in corresponding Korean Patent Application No. 10-2017-0071719, dated Mar. 14, 2018.

\* cited by examiner

*Primary Examiner* — Dean Takaoka

(74) *Attorney, Agent, or Firm* — Keating & Bennett, LLP

(57) ABSTRACT

A multiplexer includes a first filter disposed between an antenna common terminal and a first terminal, and a second filter that is disposed between the antenna common terminal and a second terminal and that has higher passband frequencies than the first filter. The second filter includes IDTs that are longitudinally coupled. Among IDT electrodes in the IDTs, first IDT electrodes are connected to the antenna common terminal side, and second IDT electrodes are connected to the second terminal side. The first and second IDT electrodes have different main pitches of the electrode fingers. At least one of the second IDT electrodes out of all of the electrode fingers has a maximum main pitch.

20 Claims, 9 Drawing Sheets

MULTIPLEXER AND RADIO-FREQUENCY (RF) FRONT-END MODULE

CROSS REFERENCE TO RELATED APPLICATIONS

This application claims the benefit of priority to Japanese Patent Application No. 2016-114557 filed on Jun. 8, 2016 and Japanese Patent Application No. 2017-075685 filed on Apr. 6, 2017. The entire contents of this application are hereby incorporated herein by reference.

BACKGROUND OF THE INVENTION

1. Field of the Invention

The present invention relates to a multiplexer, and more specifically to a multiplexer including a plurality of filters, and to a radio-frequency (RF) front-end module including the multiplexer.

2. Description of the Related Art

Mobile phones in recent years are required to individually cope with a plurality of frequency bands and with a plurality of wireless systems, that is, multi-bands and multi-modes. To cope with these requirements, a multiplexer that divides an RF signal with a plurality of wireless carrier frequencies is disposed immediately below one antenna. As one of a plurality of band-pass filters defining the multiplexer, for example, an elastic wave filter with low loss characteristics within the passband and steep passband characteristics around the passband is used.

An exemplary elastic wave filter includes a longitudinally-coupled elastic wave filter disclosed in International Publication No. WO 2013/069225, which includes five inter-digital transducers (IDTs). In this elastic wave filter, the five IDTs are arranged along an elastic wave propagating direction on a piezoelectric substrate.

In the elastic wave filter disclosed in International Publication No. WO 2013/069225, among the five IDTs, a first IDT electrode, a third IDT electrode, and a fifth IDT electrode are commonly connected to an input-side terminal (unbalanced terminal), and a second IDT electrode and a fourth IDT electrode are connected to a different output-side terminal (balanced terminal). In paragraph [0025] of International Publication No. WO 2013/069225, the pitch of electrode fingers of the first and fifth IDT electrodes is about 1.0582 μm, the pitch of electrode fingers of the second and fourth IDT electrodes is about 1.0569 μm, and the pitch of electrode fingers of the third IDT electrode is about 1.0612 μm. That is, an IDT electrode that has the maximum electrode finger pitch (the third IDT electrode in the case of International Publication No. WO 2013/069225) is connected to the input-side terminal.

SUMMARY OF THE INVENTION

To cope with multi-bands as described above, a multiplexer including a plurality of filters is used. Regarding this point, the inventors of preferred embodiments of the present invention have discovered that, when an elastic wave filter with specific electrode finger pitches is used as one of the filters of the multiplexer, the passband characteristics of the other filters defining the same multiplexer may be lowered.

Accordingly, preferred embodiments of the present invention are able to prevent lowering of a passband characteristics of filters of a multiplexer including an elastic wave filter.

According to a preferred embodiment of the present invention, a multiplexer includes a common terminal; a first terminal; a second terminal; a first filter on a channel connecting the common terminal and the first terminal; and a second filter on a channel connecting the common terminal and the second terminal, the second filter having higher passband frequencies than the first filter. The second filter is an elastic wave filter and includes a plurality of inter-digital transducers (IDTs) arranged along an elastic wave propagating direction. Each of the plurality of IDTs includes a pair of IDT electrodes that face each other. Among a plurality of IDT electrodes included in the plurality of IDTs, first IDT electrodes are connected to the common terminal side out of the common terminal and the second terminal, and second IDT electrodes are connected to the second terminal side out of the common terminal and the second terminal. The first IDT electrodes and the second IDT electrodes are each provided on a surface of a piezoelectric substrate and each include a plurality of electrode fingers arranged side by side in the elastic wave propagating direction. The first IDT electrodes and the second IDT electrodes have different main pitches of the electrode fingers. At least one of the second IDT electrodes includes a maximum main pitch of the electrode fingers, among the plurality of IDT electrodes.

By providing at least one of the second IDT electrodes as an IDT electrode that includes a maximum electrode finger main pitch as described above, the position of an unnecessary wave causing a large return loss of the second filter, which occurs in the frequency passband of the first filter, is moved out of the passband of the first filter. Accordingly, when an elastic wave filter is included in a multiplexer, the lowering of passband characteristics of the other filters of the same multiplexer is prevented.

At least one of the first IDT electrodes may have a minimum main pitch of the electrode fingers, among the plurality of IDT electrodes.

By providing at least one of the first IDT electrodes as an IDT electrode that has a minimum electrode finger main pitch as described above, the position of an unnecessary wave causing a large return loss of the second filter, which occurs in the passband of the first filter, is moved out to a higher frequency side of the passband of the first filter which is within the lower frequency side stop-band of the second filter. Accordingly, when an elastic wave filter is included in a multiplexer, the lowering of passband characteristics of the other filters of the same multiplexer is prevented.

According to a preferred embodiment of the present invention, a multiplexer includes a common terminal; a first terminal; a second terminal; a first filter on a channel connecting the common terminal and the first terminal; and a second filter on a channel connecting the common terminal and the second terminal, the second filter having higher passband frequencies than the first filter. The second filter is an elastic wave filter and includes a plurality of inter-digital transducers (IDTs) arranged along an elastic wave propagating direction. Each of the plurality of IDTs includes a pair of IDT electrodes that face each other. Among a plurality of IDT electrodes included in the plurality of IDTs, first IDT electrodes are connected to the common terminal side out of the common terminal and the second terminal, and second IDT electrodes are connected to the second terminal side out of the common terminal and the second terminal. The first IDT electrodes and the second IDT electrodes are each provided on a surface of a piezoelectric substrate and each include a plurality of electrode fingers arranged side by side in the elastic wave propagating direction. The first IDT electrodes and the second IDT electrodes have different main pitches of the electrode fingers. A total average of pitches of the electrode fingers included in the first IDT electrodes is less than a total average of pitches of the electrode fingers included in the second IDT electrodes.

By providing the total average of the pitches of the electrode fingers included in the first IDT electrodes less than the total average of the pitches of the electrode fingers included in the second IDT electrodes, the position of an unnecessary wave causing a large return loss of the second filter, which occurs in the frequency passband of the first filter, is moved out of the passband of the first filter. Accordingly, when an elastic wave filter is included in a multiplexer, the lowering of passband characteristics of the other filters defining the same multiplexer is prevented.

According to a preferred embodiment of the present invention, a multiplexer includes a common terminal; a first terminal; a second terminal; a first filter on a channel connecting the common terminal and the first terminal; and a second filter on a channel connecting the common terminal and the second terminal, the second filter having higher passband frequencies than the first filter. The second filter is an elastic wave filter and includes a plurality of inter-digital transducers (IDTs) arranged along an elastic wave propagating direction. Each of the plurality of IDTs includes a pair of IDT electrodes that face each other. Among a plurality of IDT electrodes included in the plurality of IDTs, first IDT electrodes are connected to the common terminal side out of the common terminal and the second terminal, and second IDT electrodes are connected to the second terminal side out of the common terminal and the second terminal. The first IDT electrodes and the second IDT electrodes are each provided on a surface of a piezoelectric substrate and each include a plurality of electrode fingers arranged side by side in the elastic wave propagating direction. The first IDT electrodes and the second IDT electrodes have different main pitches of the electrode fingers. When an average of pitches of the electrode fingers of each of the IDT electrodes is obtained, an IDT electrode that has a maximum average is one of the second IDT electrodes.

When the average of the pitches of the electrode fingers of each of the IDT electrodes is obtained, by providing an IDT electrode that has the maximum average as one of the second IDT electrodes, the position of an unnecessary wave causing a large return loss of the second filter, which occurs in the frequency passband of the first filter, is moved out of the passband of the first filter. Accordingly, when an elastic wave filter is included in a multiplexer, the lowering of passband characteristics of the other filters of the same multiplexer is prevented.

When the average of the pitches of the electrode fingers of each of the IDT electrodes is obtained, an IDT electrode that has a minimum average may be one of the first IDT electrodes.

By providing an IDT electrode that has the minimum average as one of the first IDT electrodes, the position of an unnecessary wave causing a large return loss of the second filter, which occurs in the passband of the first filter, is moved out to a higher frequency side of the passband of the first filter which is within the lower frequency side stop-band of the second filter. Accordingly, when an elastic wave filter is included in a multiplexer, the lowering of passband characteristics of the other filters of the same multiplexer is prevented.

A circuit element that is different from the second filter may be connected between the first IDT electrodes and the common terminal.

Even when a circuit element different from the second filter is connected between the first IDT electrodes and the common terminal, the position of an unnecessary wave causing a large return loss of the second filter, which occurs in the frequency passband of the first filter, is moved out of the passband of the first filter. Accordingly, when an elastic wave filter is included in a multiplexer, the lowering of passband characteristics of the other filters of the same multiplexer is prevented.

The second filter may include an odd number of three or more IDTs with a number of the first IDT electrodes being less than a number of the second IDT electrodes.

Accordingly, the position of an unnecessary wave causing a large return loss of the second filter, which occurs in the passband of the first filter, is easily moved out to a higher frequency side. When an elastic wave filter is included in a multiplexer, the lowering of passband characteristics of the other filters of the same multiplexer is prevented.

The second filter may include five or more IDTs.

Accordingly, the frequency passband of each of the first filter and the second filter is able to be widened.

The first filter and the second filter may both be reception filters.

Accordingly, it is possible to provide a multiplexer including a plurality of reception filters that prevent, when an elastic wave filter is used, the lowering of passband characteristics of the other filters of the same multiplexer.

When the first filter is connected to the common terminal, the second filter may be connected to the common terminal.

Accordingly, even when an unnecessary wave causing a large return loss of the second filter occurs in the passband of the first filter, the unnecessary wave is moved out of the passband of the first filter. Accordingly, when an elastic wave filter is included in a multiplexer, the lowering of passband characteristics of the other filters defining the same multiplexer is prevented.

According to a preferred embodiment of the present invention, a radio-frequency (RF) front-end module includes the above-described multiplexer.

In a multiplexer of an RF front-end module as described above, by including at least one of the second IDT electrodes as an IDT electrode that has the maximum electrode finger main pitch, the position of an unnecessary wave causing a large return loss of the second filter, which occurs in the frequency passband of the first filter, is moved out of the passband of the first filter. Accordingly, when an elastic wave filter is used in an RF front-end module, the lowering of passband characteristics of the other filters of the same RF front-end module is prevented.

Preferred embodiments of the present invention prevent in a multiplexer or an RF front-end module including the multiplexer, lowering of passband characteristics of filters of the multiplexer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
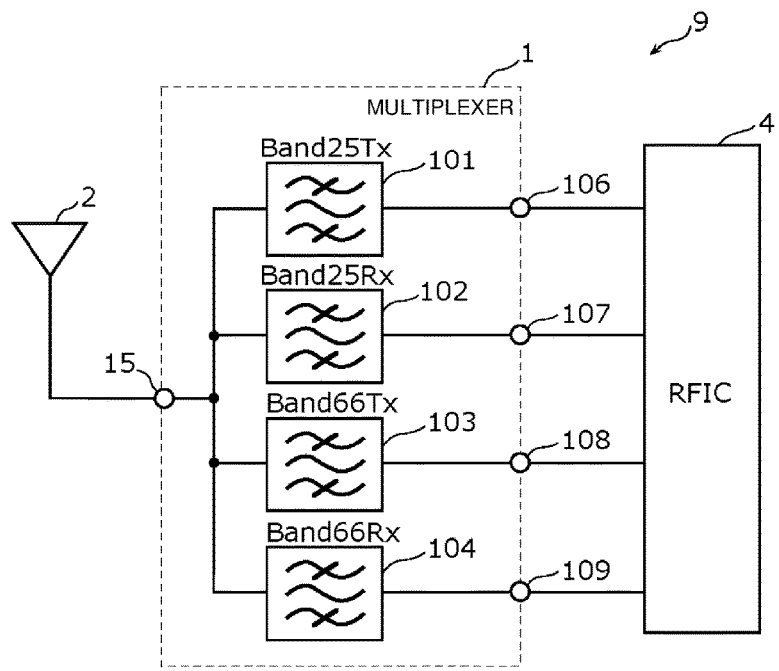
FIG. 1A is a circuit diagram of a communication apparatus including a multiplexer according to a preferred embodiment of the present invention.

Hereinafter, preferred embodiments of the present invention will be described in detail using the drawings. The preferred embodiments described below illustrate comprehensive or concrete examples. The numerals, shapes, materials, elements, and the arrangement and connections of the elements are only exemplary and are not construed to limit the present invention. Among the elements in the following preferred embodiments, elements not described in independent claims will be described as arbitrary elements. The sizes or size ratios of elements illustrated in the drawings are not necessarily exact.

Figure 1B:
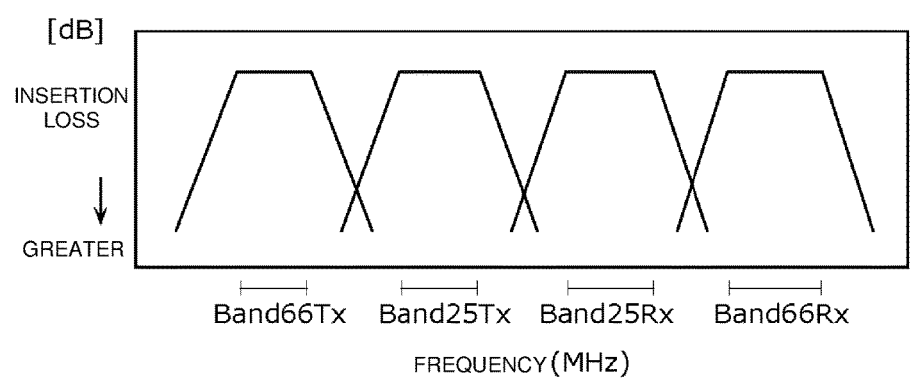
FIG. 1B is a schematic diagram illustrating the insertion loss (passband characteristics) of the multiplexer according to the preferred embodiment of the present invention shown in FIG. 1A.

FIG. 1A is a circuit diagram of a communication apparatus 9 including a multiplexer 1 according to a preferred embodiment of the present invention. FIG. 1B is a schematic diagram illustrating the insertion loss (passband characteristics) of the multiplexer 1 according to the preferred embodiment shown in FIG. 1A.

As illustrated in FIG. 1A, the communication apparatus 9 preferably includes the multiplexer 1, and a Radio-Frequency Integrated Circuit (RFIC) 4, which is a Radio-Frequency (RF) signal processing circuit. The multiplexer 1 is connected to an antenna device 2 with an antenna common terminal 15 interposed therebetween.

FIG. 1A illustrates, as an example of the multiplexer 1, a quadplexer applied to the band 25 (transmission passband: preferably about 1850 MHz to about 1915 MHz, and reception passband: preferably about 1930 MHz to about 1995 MHz) and the band 66 (transmission passband: preferably about 1710 MHz to about 1780 MHz, and reception passband: preferably about 2110 MHz to about 2200 MHz) of Long-Term Evolution (LTE).

The multiplexer 1 preferably includes transmission-side filters 101 and 103, reception-side filters 102 and 104, the antenna common terminal 15, transmission input terminals 106 and 108, and reception output terminals 107 and 109. Lead-lines of each of the transmission-side filters 101 and 103 and the receive-side filters 102 and 104 are bundled and connected to the antenna common terminal 15.

The transmission-side filters 101 and 103 are band-pass filters that receive a transmission wave generated by the RFIC 4 via the transmission input terminals 106 and 108, respectively, filter the transmission wave using their respective transmission passbands, and output the filtered transmission waves to the antenna common terminal 15.

The reception-side filters 102 and 104 are band-pass filters that receive a reception wave input from the antenna common terminal 15, filter the reception wave using their respective reception passbands, and output the filtered reception waves to the reception output terminals 107 and 109, respectively.

Here, to aid in understanding the operations of the multiplexer 1 according to the preferred embodiments of the present invention, attention is paid to two arbitrary filters included in the multiplexer 1 illustrated in FIG. 1A. The two filters of interest are referred to as a first filter 11 and a second filter 12.

Figure 2:
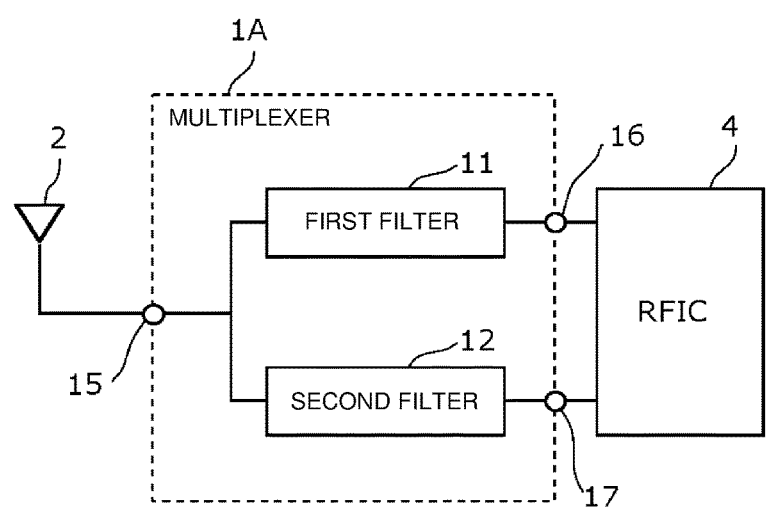
FIG. 2 is a circuit diagram illustrating a multiplexer according to a preferred embodiment of the present invention, which includes a first filter and a second filter.

FIG. 2 is a circuit diagram illustrating a multiplexer 1A including the first filter 11 and the second filter 12.

As illustrated in FIG. 2, the first filter 11 is preferably on a channel connecting the antenna common terminal 15 and a first terminal 16 and the second filter 12 is preferably on a channel connecting the antenna common terminal 15 and a second terminal 17. The second filter 12 is connected to the antenna common terminal 15 at least when the first filter 11 is connected to the antenna common terminal 15 and is performing filtering.

The second filter 12 has higher passband frequencies than the first filter 11. In the present preferred embodiment, for example, the first filter 11 preferably is a filter with a reception passband of band 25 (band 25 Rx), and the second filter 12 preferably is a filter with a reception passband of band 66 (band 66 Rx).

Figure 3:
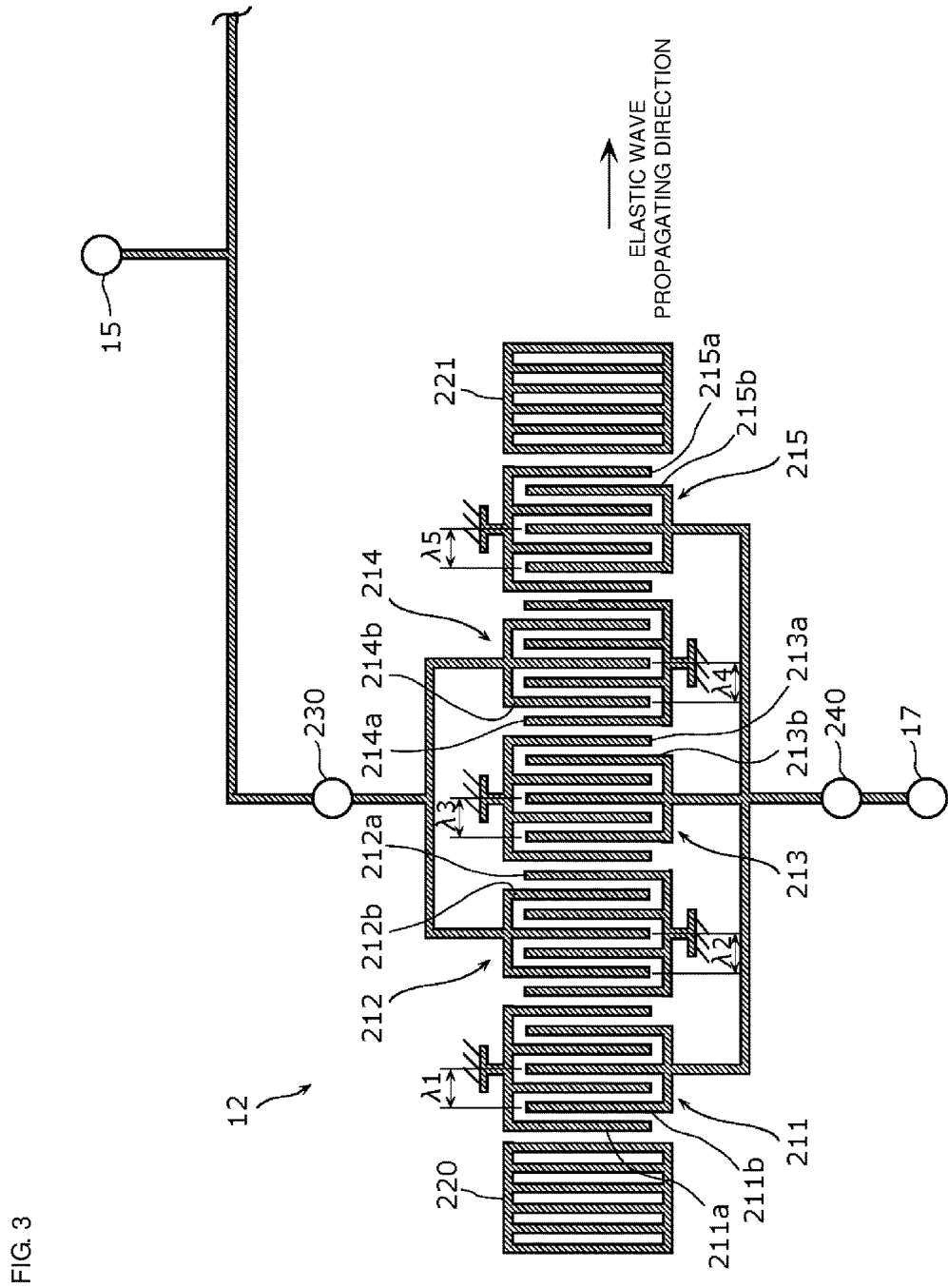
FIG. 3 is a schematic plan view illustrating the second filter of the multiplexer illustrated in FIG. 2.

FIG. 3 is a schematic plan view illustrating the second filter 12 of the multiplexer 1A.

The second filter 12 is a longitudinally-coupled elastic wave filter and preferably includes a plurality of IDTs 211, 212, 213, 214, and 215. Note that the first filter 11 may be, for example, a ladder filter including series resonators and parallel resonators, or may be a longitudinally-coupled elastic wave filter.

Before the description of the second filter 12, the structure of the IDTs 211 to 215 defining the second filter 12 will be described using an IDT 22, which is common to the IDTs 211 to 215.

Figure 4:
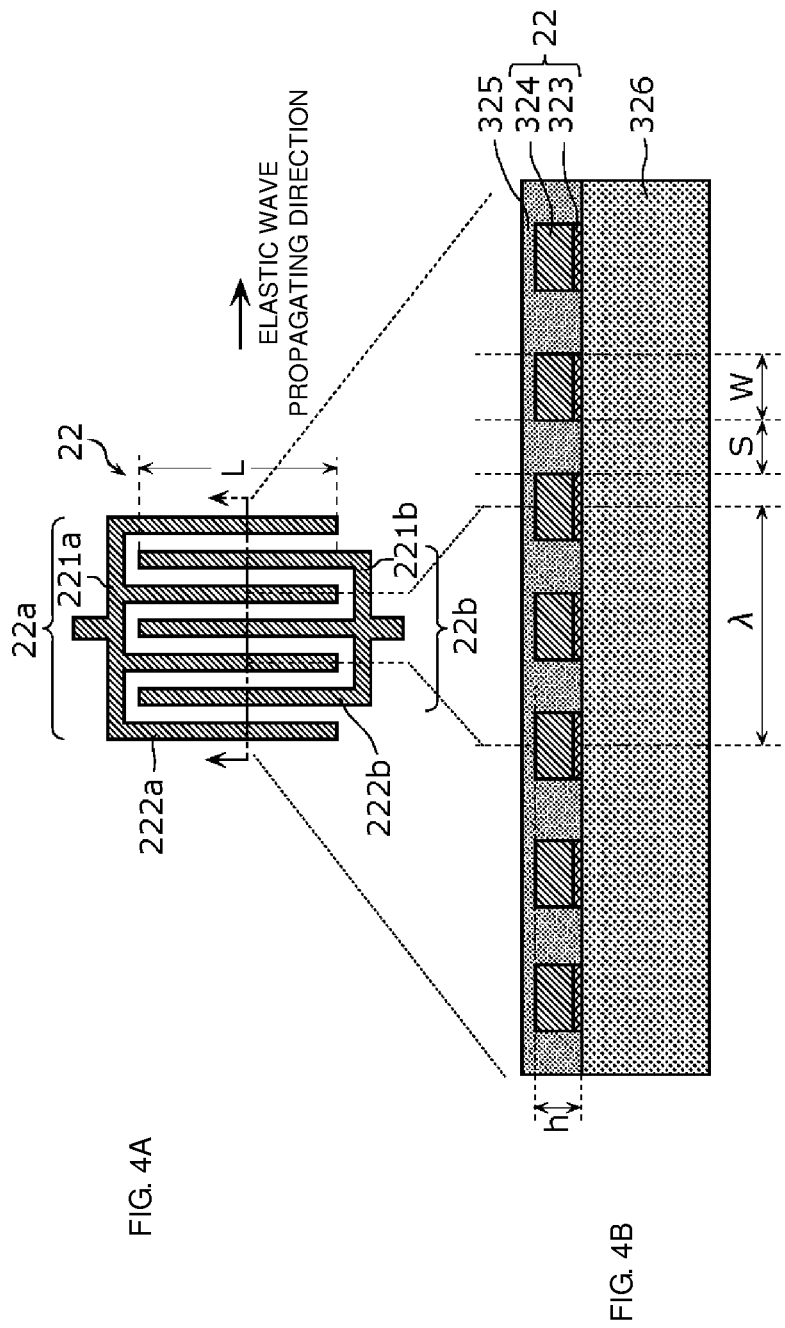
FIG. 4A is a plan view representing an IDT of the second filter illustrated in FIG. 2
FIG. 4B is a sectional view schematically representing an IDT of the second filter illustrated in FIG. 2.

FIG. 4A is a plan view representing the IDT 22 and FIG. 4B is a sectional view schematically representing the IDT 22. Note that the IDT 22 is a non-limiting example used to describe the typical structure of an elastic wave filter, and the number and length of electrode fingers of each electrode are not limited to those of the IDT 22.

The IDT 22 includes inter-digital transducer (IDT) electrodes 22a and 22b, which are comb-shaped or substantially comb-shaped.

As illustrated in FIG. 4A, the pair of IDT electrodes 22a and 22b, which face each other are on a piezoelectric substrate 326. The IDT electrode 22a includes a plurality of electrode fingers 222a, which are parallel or substantially parallel to each other, and a busbar electrode 221a, which connects the plurality of electrode fingers 222a. The IDT electrode 22b includes a plurality of electrode fingers 222b, which are parallel or substantially parallel to each other, and a busbar electrode 221b, which connects the plurality of electrode fingers 222b. The plurality of electrode fingers 222a and 222b are provided along a direction that intersects an elastic wave propagating direction. That is, the electrode fingers 222a and 222b are arranged side by side in the elastic wave propagating direction.

The IDT electrodes 22a and 22b, which respectively include the plurality of electrode fingers 222a and 222b and the busbar electrodes 221a and 221b, preferably have a multilayer structure including an adhesion layer 323 and a main electrode layer 324, as illustrated in FIG. 4B.

The adhesion layer 323 is a layer that improves the adhesion between the piezoelectric substrate 326 and the main electrode layer 324, and, for example, Ti is preferably used as a material of the adhesion layer 323. The adhesion layer 323 preferably has a film thickness of about 12 nm, for example.

As a material of the main electrode layer 324, for example, Al containing about 1% of Cu is preferably used. The main electrode layer 324 preferably has a film thickness of about 162 nm, for example.

A protection layer 325 covers the IDT electrodes 22a and 22b. The protection layer 325 is a layer that protects the main electrode layer 324 from the external environment, adjusts the frequency temperature characteristics, and improves the moisture resistance. The protection layer 325 is preferably, for example, a film containing silicon dioxide as a main component.

The piezoelectric substrate 326 is preferably made of, for example, a LiTaO$_3$ piezoelectric single crystal, a LiNbO$_3$ piezoelectric single crystal, or piezoelectric ceramics which have certain cut angles.

The non-limiting exemplary specific physical parameters of the IDT 22 will now be described. The wavelength of a surface acoustic wave (SAW) resonator is defined by a repetition pitch λ of the plurality of electrode fingers 222a and 222b defining the IDT 22 illustrated in FIG. 4B. The overlap width L of the IDT electrodes 22a and 22b is, as illustrated in FIG. 4A, an overlapping electrode finger length in the case where the electrode fingers 222a of the IDT electrode 22a and the electrode fingers 222b of the IDT electrode 22b are viewed from the elastic wave propagating direction. A duty ratio D is a line width occupancy rate of the plurality of electrode fingers 222a and 222b, which is the ratio of the line width of the electrode fingers 222a and 222b to the sum of the line width and space width of the electrode fingers 222a and 222b. More specifically, the duty ratio D is defined as W/(W+S) where W is the line width of the electrode fingers 222a and 222b of the IDT electrodes 22a and 22b, and S is the space width between the adjacent electrode fingers 222a and electrode fingers 222b.

As has been described above, the second filter 12 is a longitudinally-coupled elastic wave filter, and includes the plurality of IDTs 211 to 215, as illustrated in FIG. 3. The second filter 12 also preferably includes reflectors 220 and 221, a first port 230, and a second port 240. The first port 230 is provided on the antenna common terminal 15 side, when viewed from the plurality of IDTs 211 to 215, out of the antenna common terminal 15 and the second terminal 17. The second port 240 is provided on the second terminal 17 side, when viewed from the plurality of IDTs 211 to 215, out of the antenna common terminal 15 and the second terminal 17.

When, for example, an RF signal is input from the antenna common terminal 15 to the second filter 12, a potential difference occurs between the antenna common terminal 15 and a reference terminal (e.g., a ground terminal), which in turn deforms the piezoelectric substrate 326, thus generating a surface acoustic wave. Here, by roughly matching the pitch λ of the electrode fingers of each of the IDTs 211 to 215 with the wavelength of the passband, an RF signal with a to-be-passed frequency component is able to be passed using the second filter 12.

The IDT 211 of the second filter 12 includes a pair of IDT electrodes 211a and 211b, which face each other. Likewise, the IDTs 212 to 215 respectively include pairs of IDT electrodes 212a and 212b, 213a and 213b, 214a and 214b, and 215a and 215b, which face each other. The IDTs 211 to 215 are sequentially arranged along the elastic wave propagating direction such that they are longitudinally coupled. That is, the IDTs 212 and 214 are arranged so as to sandwich the IDT 213 in the propagating direction, and the IDTs 211 and 215 are arranged so as to sandwich the IDTs 212 to 214 in the propagating direction. The reflectors 220 and 221 sandwich the IDTs 211 to 215 in the propagating direction.

The IDTs 212 and 214 are connected in parallel between the first port 230 and the reference terminal. Specifically, the IDT electrodes 212a and 214a are connected to the reference terminal. The IDT electrodes 212b and 214b are connected to the antenna common terminal 15 side, out of the antenna common terminal 15 and the second terminal 17, with the first port 230 interposed therebetween.

The IDTs 211, 213, and 215 are connected in parallel between the second port 240 and the reference terminal. Specifically, the IDT electrodes 211a, 213a, and 215a are connected to the reference terminal. The IDT electrodes 211b, 213b, and 215b are connected to the second terminal 17 side, out of the antenna common terminal 15 and the second terminal 17, with the second port 240 interposed therebetween.

In this way in the second filter 12, among the plurality of IDTs 211 to 215, first IDT electrodes 212b and 214b are connected to the antenna common terminal 15 side, and second IDT electrodes 211b, 213b, and 215b are connected to the second terminal 17 side. That is, the connection destination of the first IDT electrodes 212b and 214b is the antenna common terminal 15, and the connection destination of the second IDT electrodes 211b, 213b, and 215b is the second terminal 17.

Table 1 illustrates the non-limiting exemplary preferred structural parameters (electrode finger main pitch λm, intersecting width L, number N of IDT pairs, and duty ratio D) of the IDTs 211 to 215.

TABLE 1

| | IDT 211b | IDT 212b | IDT 213b | IDT 214b | IDT 215b |
|---|---|---|---|---|---|
| Electrode finger main pitch λm (μm) | λ1 1.850 | λ2 1.838 (minimum) | λ3 1.854 (maximum) | λ4 1.838 (minimum) | λ5 1.850 |
| Intersecting width L (μm) | 40 | 40 | 40 | 40 | 40 |
| Number N of pairs | 21.5 | 19 | 9.5 | 19 | 21.5 |
| Duty ratio D | 0.6 | 0.6 | 0.6 | 0.6 | 0.6 |
| Connected to | Second terminal | Antenna common terminal | Second terminal | Antenna common terminal | Second terminal |

Note that the pitch of the electrode fingers of the reflectors 220 and 221 is preferably about 1.855 μm, for example, which is greater than the electrode finger main pitches λ1 to λ5 of the IDTs 211 to 215.

The electrode finger main pitches λm indicated in Table 1 are the pitches of the electrode fingers at the center of the IDT electrodes 211b to 215b, respectively. In the case of the IDT electrode 211b by way of example, the main pitch λm preferably is a pitch formed by electrode fingers that occupy about 50% or greater of all the electrode fingers of the IDT electrode 211b, for example. In a longitudinally-coupled elastic wave filter, the electrode finger pitch at two ends of the IDT electrode 211b may be made less than that at the center thereof in order to adjust the degree of coupling with the adjacently-positioned IDT electrode 212b. Thus, the electrode finger pitch λ has different values for the center and two ends of the IDT electrode 211b in the elastic wave propagating direction when viewed from the entire IDT electrode 211b. Therefore, in the present preferred embodiment, the electrode finger pitches λ of the IDT electrodes 211b to 215b may be compared using the main pitches λm.

In the present preferred embodiment as illustrated in Table 1, the electrode finger main pitches λm have the following relationship:

(λ2=λ4)<(λ1=λ5)<λ3

That is, the electrode finger main pitches λ2 and λ4 of the first IDT electrodes 212b and 214b connected to the antenna common terminal 15 are different from the electrode finger main pitches λ1, λ3, and λ5 of the second IDT electrodes 211b, 213b, and 215b connected to the second terminal 17.

Among the main pitches λ1 to λ5 of the plurality of IDT electrodes 211b to 215b, the electrode finger main pitch λ3 of the second IDT electrode 213b connected to the second terminal 17 is the maximum. Among the main pitches λ1 to λ5, the main pitches λ2 and λ4 of the IDT electrode 212b and 214b connected to the antenna common terminal 15 are the minimum.

In the present preferred embodiment, the total average of the pitches λ of the electrode fingers included in the first IDT electrodes 212b and 214b is less than the total average of the pitches λ of the electrode fingers included in the second IDT electrodes 211b, 213b, and 215b. The total average of the electrode finger pitches λ can be obtained by calculating the weighted average of the electrode finger pitches λ including those at the center and two ends of each IDT electrode. In the present preferred embodiment, the total average of the electrode finger pitches of the first IDT electrodes 212b and 214b is preferably about 1.789 μm, and the total average of the electrode finger pitches of the second IDT electrodes 211b, 213b, and 215b is preferably about 1.819 μm, for example.

In the present preferred embodiment, when the average of the electrode finger pitches λ of each of the IDT electrodes 211b to 215b is obtained, an IDT electrode that has the maximum average is one of the second IDT electrodes 211b, 213b, and 215b. The average of a plurality of electrode finger pitches λ is a value obtained for each IDT electrode by calculating the weighted average of the electrode finger pitches λ including those at the center and two ends of the IDT electrode. In the present preferred embodiment, an IDT electrode that has the maximum average is the IDT electrode 213b, and IDT electrodes that have the minimum average are the IDT electrodes 212b and 214b.

Figure 5:
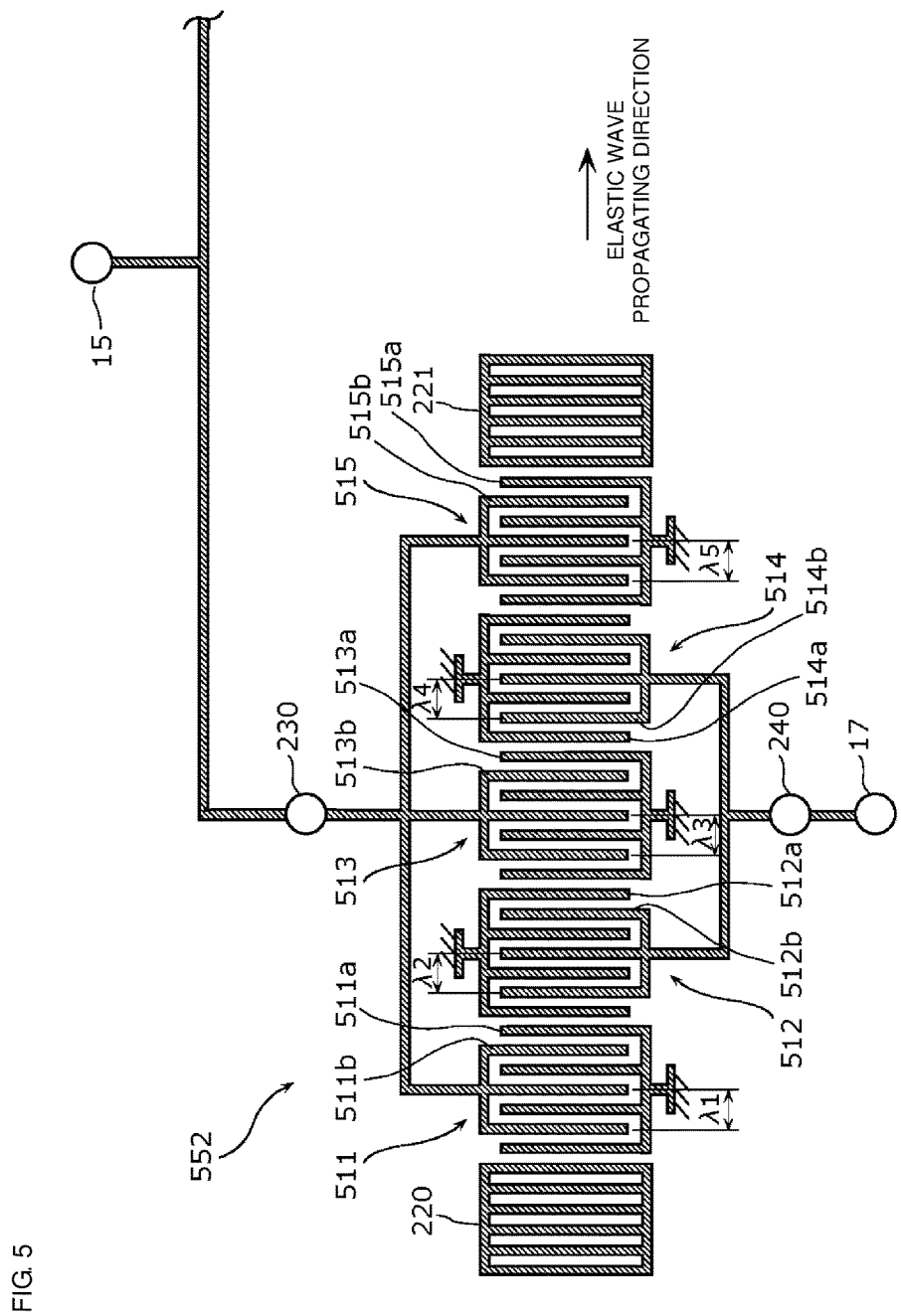
FIG. 5 is a schematic plan view illustrating a second filter of a multiplexer according to a comparative example.

FIG. 5 is a schematic plan view illustrating a second filter 552 of a multiplexer according to a comparative example.

As shown in FIG. 5, the second filter 552 preferably includes a plurality of IDTs 511 to 515, the reflectors 220 and 221, the first port 230, and the second port 240.

The IDT 511 includes a pair of IDT electrodes 511a and 511b, which face each other. Likewise, the IDTs 512 to 515 respectively include pairs of IDT electrodes 512a and 512b, 513a and 513b, 514a and 514b, and 515a and 515b, which face each other. The IDTs 511 to 515 are sequentially arranged along the elastic wave propagating direction such that they are longitudinally coupled.

The IDTs 511, 513, and 515 are connected in parallel between the first port 230 and a reference terminal (e.g., a ground terminal). Specifically, the IDT electrodes 511a, 513a, and 515a are connected to the reference terminal. Meanwhile, the IDT electrodes 511b, 513b and 515b are connected to the antenna common terminal 15 with the first port 230 interposed therebetween.

The IDTs 512 and 514 are connected in parallel between the second port 240 and the reference terminal. Specifically, the IDT electrodes 512a and 514a are connected to the reference terminal. Meanwhile, the IDT electrodes 512b and 514b are connected to the second terminal 17 with the second port 240 interposed therebetween.

In this way in the second filter 552 according to the comparative example, among the plurality of IDTs 511 to 515, first IDT electrodes 511b, 513b, and 515b are connected to the antenna common terminal 15, and second IDT electrodes 512b and 514b are connected to the second terminal 17.

Table 2 illustrates the non-limiting exemplary specific structural parameters of the IDTs 511 to 515 according to the comparative example.

TABLE 2

|  | IDT 511b | IDT 512b | IDT 513b | IDT 514b | IDT 515b |
| --- | --- | --- | --- | --- | --- |
| Electrode finger main pitch λm (μm) | λ1 1.833 | λ2 1.817 (minimum) | λ3 1.926 (maximum) | λ4 1.817 (minimum) | λ5 1.833 |
| Intersecting width L (μm) | 43 | 43 | 43 | 43 | 43 |
| Number N of pairs | 16.5 | 11 | 11.15 | 11 | 16.5 |
| Duty ratio D | 0.6 | 0.6 | 0.6 | 0.6 | 0.6 |
| Connected to | Antenna common terminal | Second terminal | Antenna common terminal | Second terminal | Antenna common terminal |

Note that the pitch of the electrode fingers of the reflectors 220 and 221 is about 1.861 μm, for example, which is greater than the electrode finger main pitch λ1 of the IDT 511 and less than the electrode finger main pitch λ3 of the IDT 513.

In the comparative example, as illustrated in Table 2, the electrode finger main pitches λm have the following relationship:

(λ2=λ4)<(λ1=λ5)<λ3

The size relationship among the electrode finger main pitches λm according to the comparative example is the same as that of the above-described preferred embodiment. However, in the comparative example, the point that the IDT electrodes 511b, 513b, and 515b are connected to the antenna common terminal 15 and the IDT electrodes 512b and 514b are connected to the second terminal 17 is different from the above-described preferred embodiment.

Hereinafter, the frequency characteristics of the multiplexers according to the preferred embodiments and the comparative example will be described.

Figure 6:
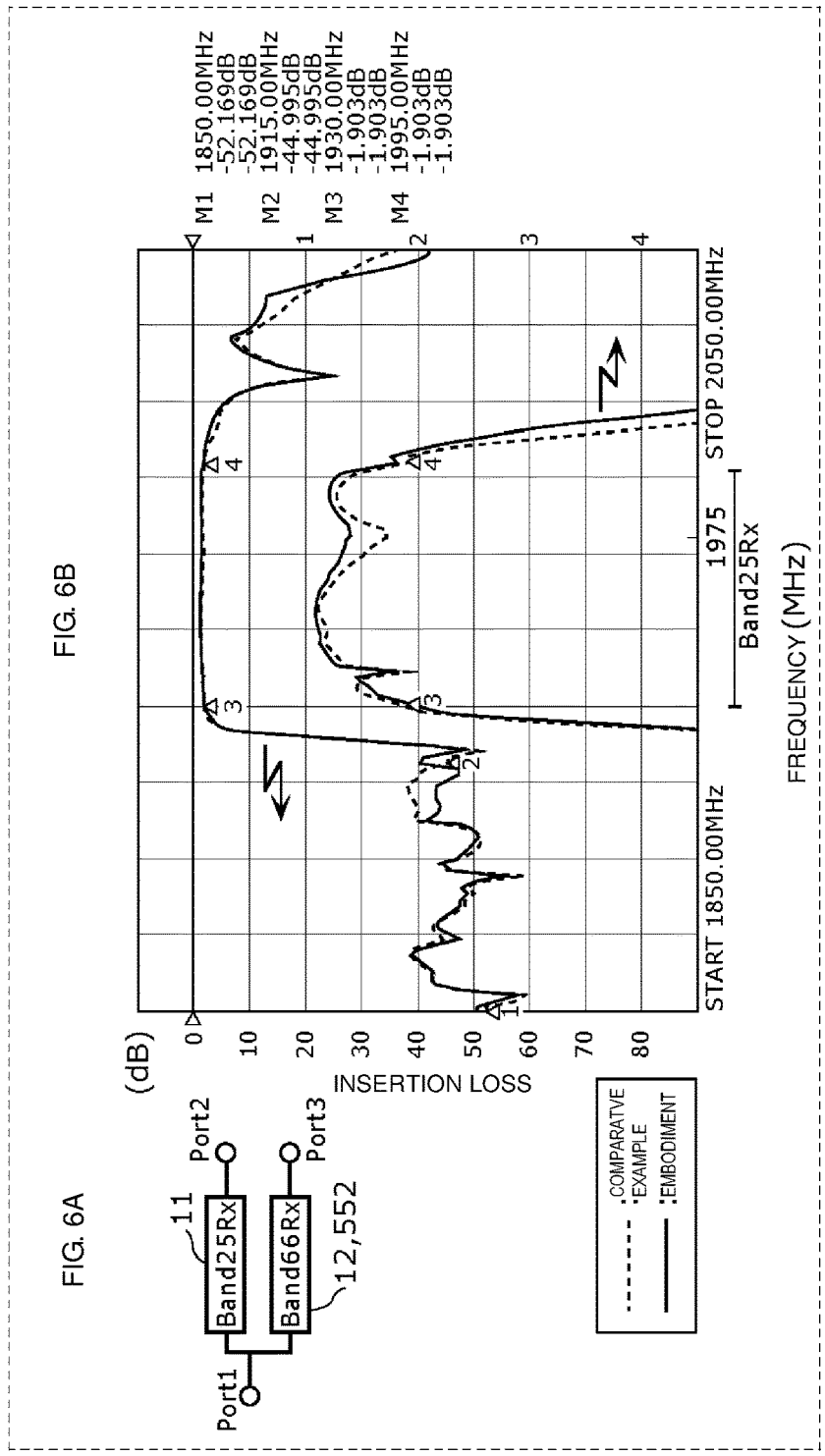
FIGS. 6A and 6B illustrate the insertion loss in the frequency passband of the first filter.

FIGS. 6A and 6B illustrate the insertion loss in the frequency passband of the first filter 11. As an evaluation circuit corresponding to the preferred embodiments of the present invention, as illustrated in FIG. 6A, a circuit that bundles lead-lines at one side of the first filter 11 and the second filter 12 is used. As an evaluation circuit corresponding to the comparative example, a circuit where the second filter 12 of the preferred embodiments is replaced by the second filter 552 of the comparative example is used.

FIG. 6B is a graph illustrating the insertion loss (passband characteristics) of each of the preferred embodiments and the comparative example from about 1850 MHz to about 2050 MHz, for example. As illustrated in FIG. 6B, the insertion loss becomes greater in the vicinity of about 1975 MHz, which is within the band of band 25 Rx, in the comparative example. In contrast, the insertion loss becomes smaller in the vicinity of about 1975 MHz in the preferred embodiments, compared with the comparative example. This difference will be described with reference to FIGS. 7A and 7B.

Figure 7:
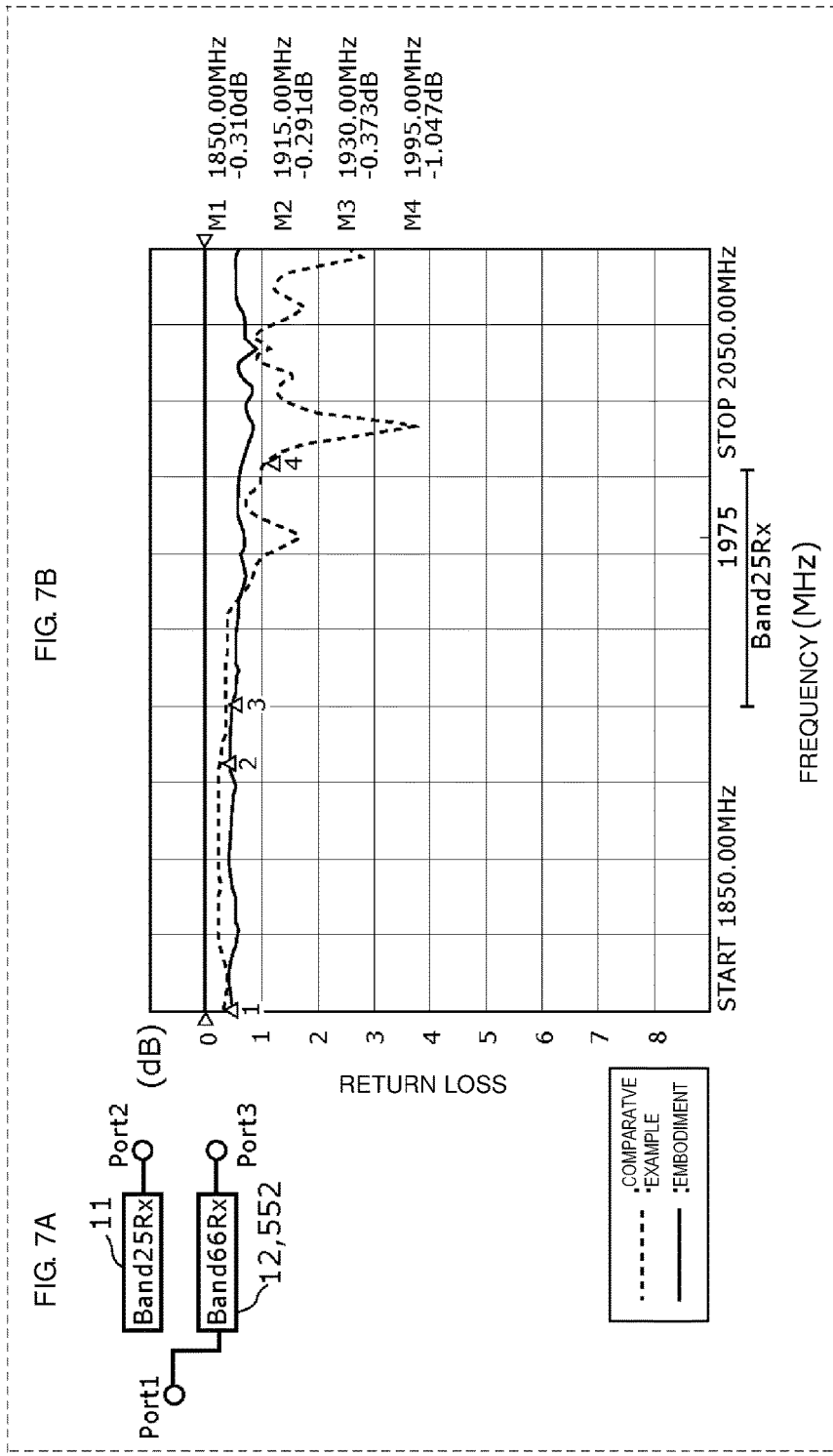
FIGS. 7A and 7B illustrate the return loss of the second filter in the frequency passband of the first filter.

FIGS. 7A and 7B illustrate the return loss of the second filter 12 (or 552) in the frequency passband of the first filter 11. As an evaluation circuit corresponding to the preferred embodiments, as illustrated in FIG. 7A, a circuit where the bundling of the first filter 11 and the second filter 12 is released and which only includes the second filter 12 is used. As an evaluation circuit corresponding to the comparative example, a circuit including only the second filter 552 of the comparative example is used.

FIG. 7B is a graph illustrating the return loss of each of the preferred embodiments and the comparative example from about 1850 MHz to about 2050 MHz, for example. As illustrated in FIG. 7B, in the comparative example, an unnecessary wave causing a large return loss occurs in the vicinity of about 1975 MHz, which is within the band of band 25 Rx. This indicates that, in the second filter 552 of the comparative example, a signal input at about 1975 MHz is not sufficiently reflected and is partly absorbed. In the comparative example, since there is this unnecessary wave in the vicinity of about 1975 MHz, it is considered that the insertion loss near about 1975 MHz becomes great, as illustrated in FIG. 6B.

In contrast, in the preferred embodiments, the return loss is small within the band of band 25 Rx. This means that by changing the electrode finger pitches λ of the IDT electrodes 211b to 215b, the position of an unnecessary wave causing a large return loss of the second filter 12, which occurs in the frequency passband (band 25 Rx) of the first filter 11, is moved out of the passband. Specifically, by increasing the electrode finger main pitches λm of the IDT electrodes 211b, 213b, and 215b connected to the second terminal 17 or decreasing the electrode finger main pitches of the IDT electrodes 212b and 214b connected to the antenna common terminal 15, the position of the above-mentioned unnecessary wave is moved out to a higher frequency side of the passband of the first filter 11. Accordingly, in the multiplexer 1A including the second filter 12 of the above-described preferred embodiment, an increase of the insertion loss is prevented in the passband of the first filter 11.

The multiplexer 1A according to the preferred embodiments includes the antenna common terminal 15, the first terminal 16, the second terminal 17, the first filter 11, which is provided on a channel connecting the antenna common terminal 15 and the first terminal 16, and the second filter 12, which is provided on a channel connecting the antenna common terminal 15 and the second terminal 17 and which has higher passband frequencies than the first filter 11.

The second filter 12 is an elastic wave filter and includes the plurality of IDTs 211 to 215 arranged along the elastic wave propagating direction. Each of the IDTs 211 to 215 includes a pair of IDT electrodes that face each other. Among IDT electrodes defining the IDTs 211 to 215, first IDT electrodes 212b and 214b are connected to the antenna common terminal 15 side, out of the antenna common terminal 15 and the second terminal 17, and second IDT electrodes 211b, 213b, and 215b are connected to the second terminal 17 side, out of the antenna common terminal 15 and the second terminal 17. The first IDT electrodes 212b and 214b and the second IDT electrodes 211b, 213b and 215b are each on the surface of the piezoelectric substrate 326 and each include a plurality of electrode fingers arranged side by side in the elastic wave propagating direction. The first IDT electrodes 212b and 214b and the second IDT electrodes 211b, 213b, and 215b have different main pitches λm of a plurality of electrode fingers arranged side by side in the elastic wave propagating direction. At least one of the second IDT electrodes 211b, 213b, and 215b has the maximum electrode finger main pitch λm among the plurality of IDT electrodes 211b to 215b.

With this configuration, the position of an unnecessary wave causing a large return loss of the second filter 12, which occurs in the frequency passband of the first filter 11, is moved out of the passband of the first filter 11. Accordingly, when an elastic wave filter is included in the multiplexer 1A, the lowering of the passband characteristics of the other filters of the same multiplexer 1A is prevented.

At least one of the first IDT electrodes 212b and 214b may have the minimum electrode finger main pitch λm among the plurality of IDT electrodes 211b to 215b.

Accordingly, the position of an unnecessary wave causing a large return loss of the second filter 12, which occurs in the passband of the first filter 11, is moved out to a higher frequency side of the passband of the first filter 11, which is within the lower frequency side stop-band of the second filter 12. Accordingly, when an elastic wave filter is included in the multiplexer 1A, the lowering of the passband characteristics of the other filters of the same multiplexer 1A is prevented.

In the multiplexer 1A according to a preferred embodiment of the present invention, the total average of the pitches λ of the electrode fingers included in the first IDT electrodes 212b and 214b is less than the total average of the pitches λ of the electrode fingers included in the second IDT electrodes 211b, 213b, and 215b.

In the multiplexer 1A according to a preferred embodiment of the present invention, when the average of the electrode finger pitches λ of each of the IDT electrodes 211b to 215b is obtained, an IDT electrode that has the maximum average is one of the second IDT electrodes 211b, 213b, and 215b.

With this configuration, the position of an unnecessary wave causing a large return loss of the second filter 12, which occurs in the frequency passband of the first filter 11, is moved out of the passband of the first filter 11. Accordingly, when an elastic wave filter is included in the multiplexer 1A, the lowering of the passband characteristics of the other filters defining the same multiplexer 1A is prevented.

Although the multiplexers 1 and 1A according to the preferred embodiments of the present invention have been described above, the present invention is not limited to the above-described preferred embodiments. For example, additional preferred embodiments obtained by adding the following modifications to the above-described preferred embodiment may be included in the present invention.

Figure 8:
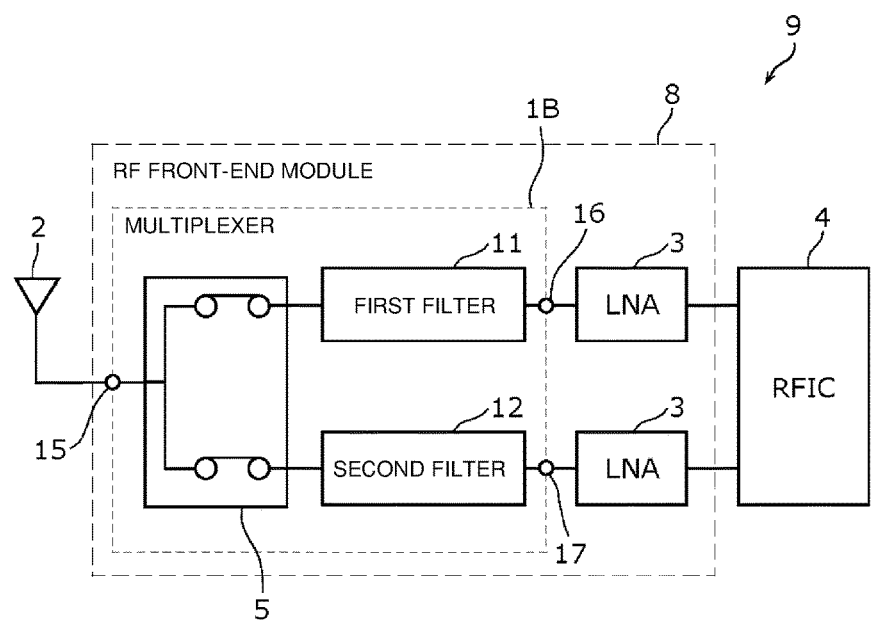
FIG. 8 is a circuit diagram of an RF front-end module including a multiplexer according to a preferred embodiment of the present invention.

FIG. 8 is a circuit diagram illustrating a radio-frequency (RF) front-end module 8 including a multiplexer 1B. In the RF front-end module 8 illustrated in FIG. 8, two low-noise amplifiers (LNAs) 3 are preferably respectively provided between the first terminal 16 and the RFIC 4 and between the second terminal 17 and the RFIC 4. To switch the connection state with the antenna device 2, a multiport switch 5 is provided between the first filter 11 and the antenna common terminal 15 and between the second filter 12 and the antenna common terminal 15. The multiport switch 5 is a switch that is able to simultaneously turn ON/OFF a plurality of connections. With the multiport switch 5, when the first filter 11 is connected to the antenna common terminal 15, that is, when the first filter 11 is processing signals, the second filter 12 can also be connected to the antenna common terminal 15.

Like the above-described preferred embodiments, also in the RF front-end module 8 with such a circuit configuration, when an elastic wave filter is included in the multiplexer 1B, the lowering of the passband characteristics of the other filters of the same multiplexer 1B is prevented.

Although the example where both the first filter 11 and the second filter 12 of the multiplexer 1A are reception filters has been described in the preferred embodiments, the preferred embodiments are not limited to this example, and both the filters 11 and 12 may be transmission filters, or one of the filters 11 and 12 may be a reception filter and the other may be a transmission filter, for example. Specifically, a band-pass filter of the band 66 Rx may define and function as the second filter 12, and one of band-pass filters of the band 25 Tx and band 66 Tx may define and function as the first filter 11. Alternatively, a band-pass filter of the band 25 Rx may define and function as the second filter 12, and one of band-pass filters of the band 66 Tx and band 25 Tx may define and function as the first filter 11. Alternatively, a band-pass filter of the band 25 Tx may define and function as the second filter 12, and a band-pass filter of the band 66 Tx may define and function as the first filter 11.

For example, additional preferred embodiments obtained by adding the following modifications to the above-described preferred embodiments may be included in the present invention.

Figure 9:
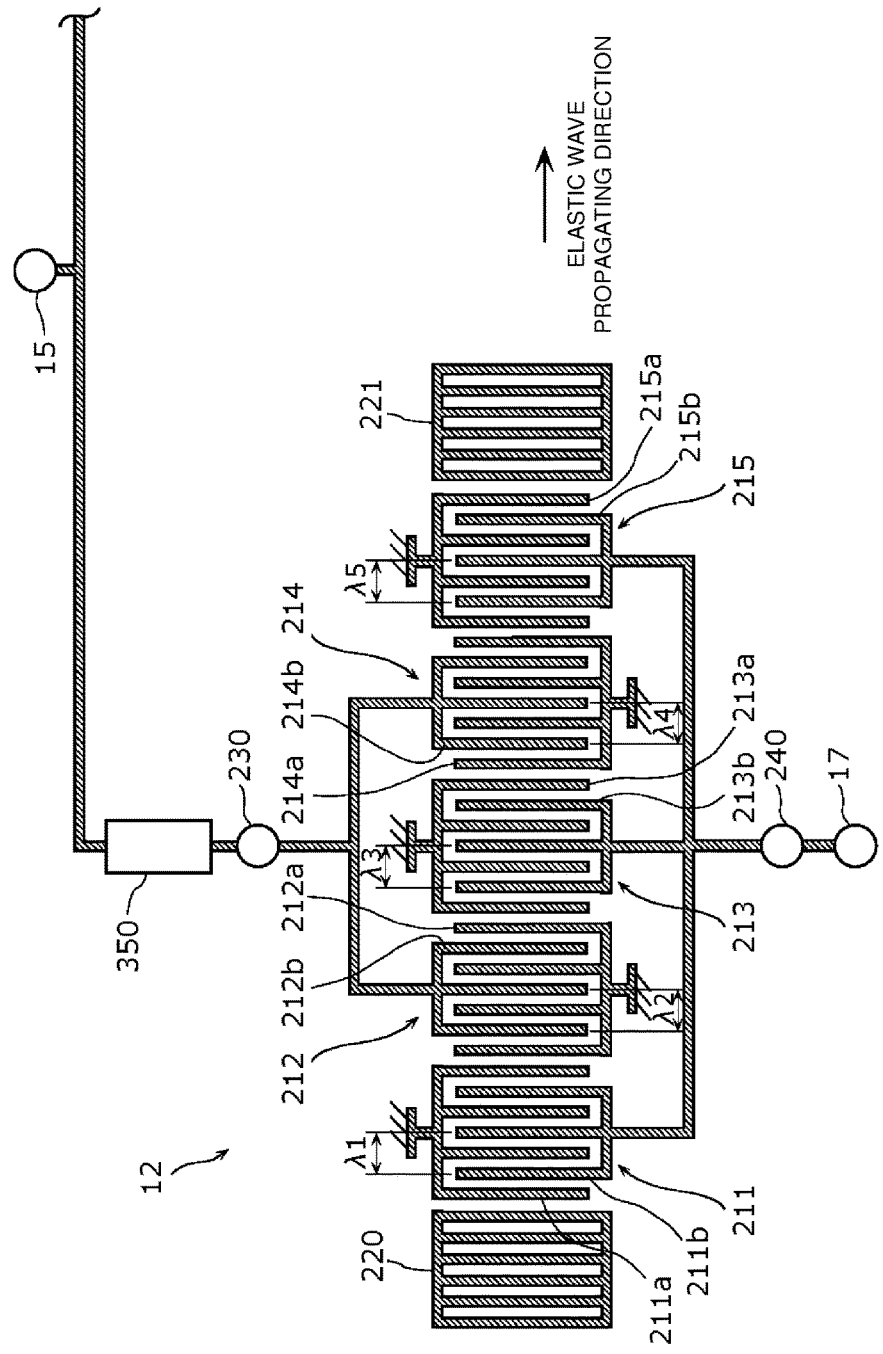
FIG. 9 is a schematic plan view illustrating the configuration of a second filter side of a multiplexer according to another preferred embodiment of the present invention.

FIG. 9 is a schematic plan view illustrating the configuration of the second filter 12 side of a multiplexer according to another preferred embodiment of the present invention.

In the multiplexer according to this preferred embodiment, a circuit element 350 is connected between the first IDT electrodes 212b and 214b of the second filter 12 and the antenna common terminal 15. Specifically, the circuit element 350, which is different from the second filter 12, is connected in series between the first port 230 and the antenna common terminal 15. The circuit element 350 is preferably, for example, an inductor, a capacitor, a switch, an LC resonator, or an elastic wave resonator. For example, the LC resonator and the elastic wave resonator may be series resonators or parallel resonators, or may be resonators including both a series resonator and a parallel resonator. The circuit element 350 may be provided as a frequency trap or to provide impedance matching.

In the preferred embodiments of the present invention, even when the circuit element 350 is connected between the first IDT electrodes 212b and 214b and the antenna common terminal 15 as described above, the position of an unnecessary wave causing a large return loss of the second filter 12, which occurs in the frequency passband of the first filter 11, is moved out of the passband of the first filter 11. Accordingly, when an elastic wave filter is included in a multiplexer, the lowering of the passband characteristics of the other filters of the same multiplexer is prevented.

In the above-described preferred embodiments, a surface acoustic wave (SAW) filter including IDT electrodes has been illustrated as the multiplexers 1 and 1A and the RF front-end module 8. However, each filter defining the multiplexers 1 and 1A and the RF front-end module 8 may alternatively be an elastic wave filter using a boundary acoustic wave. Even in this case, the same advantageous effects as those of the multiplexers 1 and 1A and the RF front-end module 8 according to the above-described preferred embodiments are achieved.

The piezoelectric substrate 326 included in the SAW filter may have a multilayer structure in which a high-acoustic-velocity supporting substrate, a low-acoustic-velocity film, and a piezoelectric film are laminated in this order. The piezoelectric film is preferably made of, for example, a 50° Y-cut X-propagation $LiTaO_3$ piezoelectric single crystal or piezoelectric ceramics (lithium tantalate single crystal or ceramics cut along a face that has, as a normal, an axis rotated by 50° from the Y-axis around the X-axis serving as the central axis, which is single crystal or ceramics where a surface acoustic wave propagates in the X-axis direction). The piezoelectric film preferably has a thickness of about 600 nm, for example. The high-acoustic-velocity supporting substrate is a substrate that supports the low-acoustic-velocity film, the piezoelectric film, and IDT electrodes. The high-acoustic-velocity supporting substrate is a substrate where the acoustic velocity of a bulk wave in the high-acoustic-velocity supporting substrate is higher than that of a surface acoustic wave or a boundary acoustic wave propagating in the piezoelectric film, and shuts a surface acoustic wave in a portion where the piezoelectric film and the low-acoustic-velocity film are laminated, thus preventing the surface acoustic wave from leaking downward below the high-acoustic-velocity supporting substrate. The high-acoustic-velocity supporting substrate is preferably, for example, a silicon substrate, and has a thickness of about 200 μm, for example. The low-acoustic-velocity film is a film where the acoustic velocity of a bulk wave in the low-acoustic-velocity film is lower than that of a bulk wave propagating in the piezoelectric film, and is disposed between the piezoelectric film and the high-acoustic-velocity supporting substrate. With this structure and the characteristic that energy is concentrated in a medium where the acoustic velocity of an elastic wave is low, the leaking of a SAW energy to the outside of the IDT electrodes is significantly reduced or prevented. The low-acoustic-velocity film is, for example, a film that has silicon dioxide as a main component, and preferably has a thickness of about 670 nm, for example. With this multilayer structure, compared with the structure where the piezoelectric substrate 326 is used as a single layer, the Q value of a resonant frequency and an anti-resonant frequency is able to greatly increased. That is, because a SAW resonator with a high Q value is able to be provided, a filter with a low insertion loss is able to include this SAW resonator.

Preferred embodiments of the present invention can be widely used as a low-loss multiplexer and RF front-end module, which are applicable to frequency standards with multi-bands and multi-modes, in a communication device such as a cellular phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
a common terminal;
a first terminal;
a second terminal;
a first filter on a channel connecting the common terminal and the first terminal; and
a second filter on a channel connecting the common terminal and the second terminal, the second filter having higher passband frequencies than the first filter; wherein
the second filter is an elastic wave filter and includes a plurality of Inter-Digital Transducers (IDTs) arranged along an elastic wave propagating direction;
each of the plurality of IDTs includes a pair of IDT electrodes that face each other;
among the plurality of IDTs, first IDT electrodes are connected to a common terminal side out of the common terminal and the second terminal, and second IDT electrodes are connected to a second terminal side out of the common terminal and the second terminal;
the first IDT electrodes and the second IDT electrodes are each provided on a surface of a piezoelectric substrate and each include a plurality of electrode fingers arranged side by side in the elastic wave propagating direction;
the first IDT electrodes and the second IDT electrodes have different main pitches of the electrode fingers; and
at least one of the second IDT electrodes has a maximum main pitch of the electrode fingers among main pitches of all of the plurality of IDT electrodes.

2. The multiplexer according to claim 1, wherein at least one of the first IDT electrodes has a minimum main pitch of the electrode fingers among the main pitches of all of the plurality of IDT electrodes.

3. The multiplexer according to claim 1, wherein a circuit element that is different from the second filter is connected between the first IDT electrodes and the common terminal.

4. The multiplexer according to claim 1, wherein
the second filter includes an odd number of three or more IDTs; and
a number of the first IDT electrodes is less than a number of the second IDT electrodes.

5. The multiplexer according to claim 1, wherein the second filter includes five or more IDTs.

6. The multiplexer according to claim 1, wherein the first filter and the second filter are reception filters.

7. The multiplexer according to claim 1, wherein the first filter is connected to the common terminal and the second filter is connected to the common terminal.

8. A Radio-Frequency (RF) front-end module comprising the multiplexer according to claim 1.

9. The multiplexer according to claim 1, wherein the second filter includes a plurality of reflectors.

10. A multiplexer comprising:
a common terminal;
a first terminal;
a second terminal;
a first filter on a channel connecting the common terminal and the first terminal; and
a second filter on a channel connecting the common terminal and the second terminal, the second filter having higher passband frequencies than the first filter; wherein
the second filter is an elastic wave filter and includes a plurality of Inter-Digital Transducers (IDTs) arranged along an elastic wave propagating direction;
each of the plurality of IDTs includes a pair of IDT electrodes that face each other;
among the plurality of IDTs, first IDT electrodes are connected to a common terminal side out of the common terminal and the second terminal, and second IDT electrodes are connected to a second terminal side out of the common terminal and the second terminal;
the first IDT electrodes and the second IDT electrodes are each provided on a surface of a piezoelectric substrate and each include a plurality of electrode fingers arranged side by side in the elastic wave propagating direction;
the first IDT electrodes and the second IDT electrodes have different main pitches of the electrode fingers; and
a total average of pitches of the electrode fingers included in the first IDT electrodes is less than a total average of pitches of the electrode fingers included in the second IDT electrodes.

11. The multiplexer according to claim 10, wherein a circuit element that is different from the second filter is connected between the first IDT electrodes and the common terminal.

12. The multiplexer according to claim 10, wherein
the second filter includes an odd number of three or more IDTs; and
a number of the first IDT electrodes is less than a number of the second IDT electrodes.

13. The multiplexer according to claim 10, wherein the second filter includes five or more IDTs.

14. The multiplexer according to claim 10, wherein the first filter and the second filter are reception filters.

15. A multiplexer comprising:
a common terminal;
a first terminal;
a second terminal;
a first filter on a channel connecting the common terminal and the first terminal; and
a second filter on a channel connecting the common terminal and the second terminal, the second filter having higher passband frequencies than the first filter; wherein
the second filter is an elastic wave filter and includes a plurality of Inter-Digital transducers (IDTs) arranged along an elastic wave propagating direction;
each of the plurality of IDTs includes a pair of IDT electrodes that face each other;
among the plurality of IDTs, first IDT electrodes are connected to a common terminal side out of the common terminal and the second terminal, and second IDT electrodes are connected to a second terminal side out of the common terminal and the second terminal;
the first IDT electrodes and the second IDT electrodes are each provided on a surface of a piezoelectric substrate and each include a plurality of electrode fingers arranged side by side in the elastic wave propagating direction;
the first IDT electrodes and the second IDT electrodes have different main pitches of the electrode fingers; and
an IDT electrode that has a maximum average pitch out of all of average pitches of the electrode fingers of each of the IDT electrodes is one of the second IDT electrodes.

16. The multiplexer according to claim 15, wherein an IDT electrode that has a minimum average pitch out of all of the average pitches of the electrode fingers is one of the first IDT electrodes.

17. The multiplexer according to claim 15, wherein a circuit element that is different from the second filter is connected between the first IDT electrodes and the common terminal.

18. The multiplexer according to claim 15, wherein
   the second filter includes an odd number of three or more IDTs; and
   a number of the first IDT electrodes is less than a number of the second IDT electrodes.

19. The multiplexer according to claim 15, wherein the second filter includes five or more IDTs.

20. The multiplexer according to claim 15, wherein the first filter and the second filter are reception filters.

\* \* \* \* \*